United States Patent [19]
Tsutsui

[11] Patent Number: 5,737,718
[45] Date of Patent: Apr. 7, 1998

[54] METHOD, APPARATUS AND RECORDING MEDIUM FOR A CODER WITH A SPECTRAL-SHAPE-ADAPTIVE SUBBAND CONFIGURATION

[75] Inventor: Kyoya Tsutsui, Kanagawa, Japan

[73] Assignee: Sony Corporation, Tokyo, Japan

[21] Appl. No.: 488,573

[22] Filed: Jun. 8, 1995

[30] Foreign Application Priority Data

Jun. 13, 1994 [JP] Japan .................................. 6-130654

[51] Int. Cl.$^6$ .................................................. G01L 7/04
[52] U.S. Cl. .................. 704/205; 704/209; 704/299; 704/230; 704/269
[58] Field of Search .................... 395/2.14, 2.15, 395/2.18, 2.38, 2.39, 2.78

[56] References Cited

U.S. PATENT DOCUMENTS

5,583,967 12/1996 Akagiri .................................. 395/2.38

Primary Examiner—Allen R. MacDonald
Assistant Examiner—Tālivaldis Ivars Šmits
Attorney, Agent, or Firm—Limbach & Limbach L.L.P.; Seong-Kun Oh

[57] ABSTRACT

A method for encoding the information is provided which realizes a high encoding efficiency especially for tonal acoustic signals without lowering the sound quality. An acoustic signal from a terminal is transformed by a transform circuit into spectral signals which are then normalized and quantized by a signal component encoding circuit for encoding from one encoding unit to another. The encoding unit configuration is selected by an encoding unit configuration decision circuit from plural encoding unit configurations depending upon the shape of distribution of the spectral components. An encoding unit of narrow low bandwidth is selected for a tonal signal.

16 Claims, 10 Drawing Sheets

METHOD, APPARATUS AND RECORDING MEDIUM FOR A CODER WITH A SPECTRAL-SHAPE-ADAPTIVE SUBBAND CONFIGURATION

BACKGROUND OF THE INVENTION

This invention relates to an information encoding method and apparatus, an information decoding method and apparatus and an information transmission method for encoding input digital data by high efficiency encoding, transmitting, recording, reproducing and decoding playback signals. The invention also relates to an information recording medium having the information recorded thereon by the encoding method and apparatus.

There exist a variety of high efficiency encoding techniques of encoding audio or speech signals. Examples of these techniques include transform coding in which a frame of digital signals representing the audio signal on the time axis is converted by an orthogonal transform into a block of spectral coefficients representing the audio signal on the frequency axis, and a sub-band coding in which the frequency band of the audio signal is divided by a filter bank into a plurality of sub-bands without forming the signal into frames along the time axis prior to coding. There is also known a combination of sub-band coding and transform coding, in which digital signals representing the audio signal are divided into a plurality of frequency ranges by sub-band coding, and transform coding is applied to each of the frequency ranges.

Among the filters for dividing a frequency spectrum into a plurality of equal-width frequency ranges, there is the quadrature mirror filter (QMF) as discussed in R. E. Crochiere, "Digital Coding of Speech in sub-bands", 55 Bell Syst.Tech J. No. 8 (1976).

In "Polyphase Quadrature Filters— A New Subband Coding Technique", Joseph H. Rothweiler ICASSP 83, Boston, there is shown a technique of dividing the frequency spectrum of the signal into equal-width frequency bands.

There is also known a technique of orthogonal transform including dividing the digital input audio signal into frames of a predetermined time duration, and processing the resulting frames using a discrete Fourier transform (DFT), discrete cosine transform (DCT) and modified DCT (MDCT) for converting the signal from the time axis to the frequency axis. Discussions on MDCT may be found in J. P. Princen and A. B. Bradley, "Subband Transform Coding Using Filter Bank Based on Time Domain Aliasing Cancellation", ICASSP 1987.

By quantizing the signals divided on the band basis by the filter or orthogonal transform., it becomes possible to control the band subjected to quantization noise and psychoacoustically more efficient coding may be achieved by utilizing the so-called masking effects. If the signal components are normalized from band to band with respect to the maximum value of the absolute values of the signal components, it becomes possible to effect a more efficient coding.

In a technique for quantizing spectral coefficients resulting from an orthogonal transform, it is known to use sub bands that take advantage of the psychoacoustic characteristics of the human auditory system. That is, spectral coefficients representing an audio signal on the frequency axis may be divided into a plurality of critical frequency bands. The widths of the critical bands increase with increasing frequency. Normally, about 25 critical bands are used to cover the audio frequency spectrum of 0 Hz to 20 kHz. In such a quantizing system, bits are adaptively allocated among the various critical bands. For example, when applying adaptive bit allocation to the spectral coefficient data resulting from MDCT, the spectral coefficient data generated by the MDCT within each of the critical bands is quantized using an adaptively allocated number of bits.

There are presently known the following two bit allocation techniques. For example, in IEEE Transactions of Acoustics, Speech and Signal Processing, vol. ASSP-25, No. 4, August 1977, bit allocation is carried out on the basis of the amplitude of the signal in each critical band. This technique produces a flat quantization noise spectrum and minimizes the noise energy, but the noise level perceived by the listener is not optimum because this technique does not effectively exploit the psychoacoustic masking effect.

In the bit allocation technique described in M. A. Krassner, (The critical Band Encoder-Digital Encoding of the Perceptual Requirements of the Auditory System), ICASSP 1980, the psychoacoustic masking mechanism is used to determine a fixed bit allocation that produces the necessary signal-to-noise ratio for each critical band. However, if the signal-to-noise ratio of such a system is measured using a strongly tonal signal, for example, a sine wave, non-optimum results are obtained because of the fixed allocation of bits among the critical bands.

For overcoming these inconveniences, a high efficiency encoding apparatus has been proposed in which the total number of bits available for bit allocation is divided between a fixed bit allocation pattern pre-set for each small block and a block-based signal magnitude dependent bit allocation, and the division ratio is set in dependence upon a signal which is relevant to the input signal such that the smoother the signal spectrum, the higher becomes the division ratio for the fixed bit allocation pattern.

With this technique, if the energy is concentrated in a particular spectral component, as in the case of a sine wave input, a larger number of bits are allocated to the block containing the spectral component/for significantly improving the signal-to-noise characteristics in their entirety. Since the human auditory system is highly sensitive to a signal having acute spectral components, such technique may be employed for improving the signal-to-noise ratio for improving not only measured values but also the quality of the sound as perceived by the ear.

In addition to the above techniques, a variety of other techniques have been proposed, and the model simulating the human auditory system has been refined, such that, if the encoding device is improved in its ability, encoding may be achieved with higher efficiency in consideration of the human auditory system.

With the above-described conventional methods, the frequency components are quantized in present bands. Thus, if the spectral components are concentrated in the vicinity of a few particular frequencies, and these spectral components are quantized with sufficiently fine quantization steps, a large number of bits need to be allocated to a number of spectral components in the same band as that of the particular frequency.

In general, the noise added to tonal acoustic signals, the energy of which is concentrated in a particular frequency, tends to be felt more distinctly by the ear than the noise added to the acoustic signal distributed smoothly over a broad frequency range. On the other hand, if the spectral component having a large energy is not quantized with sufficiently fine quantization steps, block-to-block signal distortion becomes larger when the spectral signals are restored to waveform signals on the time axis for synthesis with temporally previous and temporally succeeding blocks, thus proving a significant hindrance to the hearing sense. Thus it has been difficult with the conventional method to raise the encoding efficiency for, above all, the tonal acoustic signals, without deteriorating the sound quality.

SUMMARY OF THE INVENTION

In view of the foregoing, it is a principal object of the present invention to provide an information encoding method and apparatus, an information decoding method and apparatus and an information recording medium whereby a high encoding efficiency may be realized without deteriorating the sound quality of tonal acoustic signals.

In one aspect, the present invention provides a method for encoding information which includes the steps of transforming an input signal into frequency components with transform means, normalizing and quantizing an output of the transform means from one encoding unit to another for encoding resulting data, and providing a plurality of encoding unit configuration modes of resolving the frequency components into plural encoding units and adaptively selecting and determining one of the encoding unit configuration modes depending depending upon the spectral shape of the frequency components. The present invention also provides an apparatus for carrying out the encoding method.

With the encoding method and apparatus of the present invention, each encoding unit contains plural frequency components for different frequencies. The plural encoding unit configuration modes are set from one pre-set frequency band to another. The plural encoding unit configuration modes are set for the entire frequency range. If the spectral signals on the frequency domain exhibit a flatter energy distribution, the frequency components are resolved into a fewer number of encoding units of broader bandwidths. The input signal may be an acoustic signal.

By way of an example, the encoding unit configuration mode may be such a mode in which the bandwidth of the encoding unit is changed in dependence upon the signal distribution of the input spectral signals. Specifically, if the spectral components of a signal to be encoded exhibit a flatter energy distribution, the encoding unit is of a broad bandwidth. Conversely, if the signal to be encoded is a tonal signal in which the energy distribution is concentrated in a small number of spectral components, the encoding unit is of a narrow bandwidth.

In another aspect, the present invention provides a method for decoding the information which includes the steps of decoding the encoding unit configuration information data, and inverse transforming the frequency components into time-domain signals, and de-normalizing and inverse quantizing the frequency components for each of the encoding units of the selected encoding unit configuration based upon the encoding unit configuration information data decoded by the encoding unit configuration information data decoding step. The present invention also provides an apparatus for decoding the information.

With the decoding method and apparatus of the present invention, each encoding unit similarly contains plural frequency components for different frequencies. The plural encoding unit configuration modes are set from one pre-set frequency band to another. The plural encoding unit configuration modes are set for the entire frequency range. The input signal may be an acoustic signal.

In still another aspect, the present invention provides an information recording medium having recorded thereon encoding unit configuration information data specifying the mode of the unit configuration at the time of resolving signal frequency components into encoding units as units of encoding, and signal component information data encoded for each encoding unit determined by the encoding unit configuration information data.

With the information encoding method and apparatus of the present invention, plural methods of resolving the frequency components into encoding units are provided, even although the frequency resolution in the transform of the input signal into frequency components remains the same, and the encoding unit configuration is adaptively set depending upon e.g., energy distribution of the frequency components, while the encoding by normalization and quantization is carried out from one encoding unit to another, so that efficient encoding of the waveform signal becomes feasible depending on the distribution of the spectral components. Above all, if the encoding method and apparatus are applied to encoding of acoustic signals, the tonal components which are important to the hearing sense can be encoded with high fidelity thus enabling signal compression with high efficiency.

With the information decoding method and apparatus of the present invention, the operation of de-normalization and de-quantization of frequency components for decoding is carried out for each encoding unit of the selected encoding unit configuration based upon the decoded encoding unit information data for achieving optimum playback signals with a small number of bits thereby producing playback acoustic signals having optimum sound quality.

With the information encoding method and apparatus of the present invention, an input signal is transformed into frequency components, an output of the transform means is encoded by normalization and quantization from one encoding unit to another. A plurality of encoding unit configuration modes of resolving the frequency components into plural encoding units are provided and one of the encoding unit configuration modes is selected depending upon, for example the energy distribution of the frequency components. Thus it becomes possible to encode the input waveform signal efficiently in accordance with the spectral energy distribution. When the encoding method and apparatus are applied to encoding of acoustic signals, the tonal components which are important for the acoustic sense may be encoded with high fidelity without lowering the encoding efficiency of the spectral signal having flatter energy distribution, thus enabling highly efficient signal compression.

With the information decoding method and apparatus of the present invention, the frequency components are decoded by denormalization and quantization for each of the encoding units selected from plural encoding unit configurations, thereby producing optimum playback signals with a smaller number of bits and a playback acoustic signal having optimum sound quality.

With the information recording medium, having recorded thereon encoding unit configuration information data and signal component information data encoded for each encoding unit determined by the encoding unit configuration information data, the information recorded thereon is the information encoded highly efficiently with a small number of bits, thus enabling the recording capacity of the recording medium to be substantially increased.

DESCRIPTION OF THE PREFERRED EMBODIMENTS

Referring to the drawings, preferred embodiments of the present invention will be explained in detail.

Figure 1:
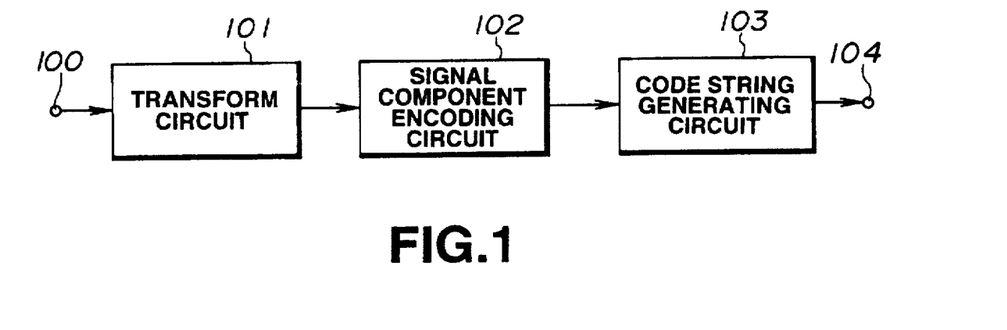
FIG. 1 is a block diagram showing an encoder according to the present invention.

FIG. 1 shows, in a schematic block diagram, a configuration of an information encoder (encoding apparatus) for carrying out the encoding method of the present invention.

Referring to FIG. 1, a waveform of the acoustic signal supplied via a terminal 100 is transformed by a frequency transform circuit 101 into signal frequency components which are then encoded by a signal component encoding circuit 102. The encoded signal is then supplied to a code string generating circuit 103 where a code string is generated and outputted at a terminal 104.

Figure 2:
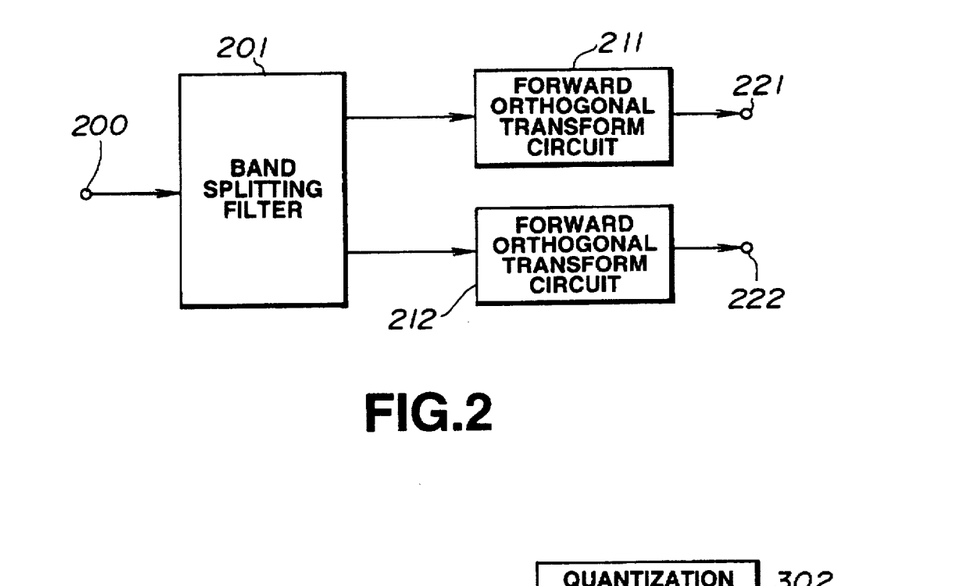
FIG. 2 is a block diagram showing a frequency transform circuit in the encoder shown in FIG. 1.

FIG. 2 shows, in a block diagram, an illustrative construction of the transform circuit 101 shown in FIG. 1.

Referring to FIG. 2, an input signal at a terminal 200, that is a signal produced at the terminal 100 of FIG. 1, is split by a band splitting circuit 201 into two frequency bands. The signals of the respective bands from the band-splitting filter 201 are transformed into spectral signal components by forward orthogonal transform circuits 211, 212 performing orthogonal transform, such as MDCT units. Outputs of the forward orthogonal transform circuits 211, 212 are taken out at terminals 221, 222 and thence supplied to the signal component encoding circuit 102.

The bandwidths of signals from the forward orthogonal transform circuits 211, 212 are one-half the bandwidth of the signal via the terminal 200, with the signal components being thinned by one-half of those supplied at the terminal 200. The transform means may be modified from those shown herein and may be implemented by DFT or DCT in place of MDCT. It is possible to split the signal frequency spectrum into plural band components. However, since the method of the present invention is most effective in cases wherein the energy is concentrated in a particular frequency, it is convenient to transform the signals into frequency-domain signals by the above-mentioned orthogonal transform in which a large number of spectral components may be obtained by a smaller amount of arithmetic-logical operations.

Figure 3:
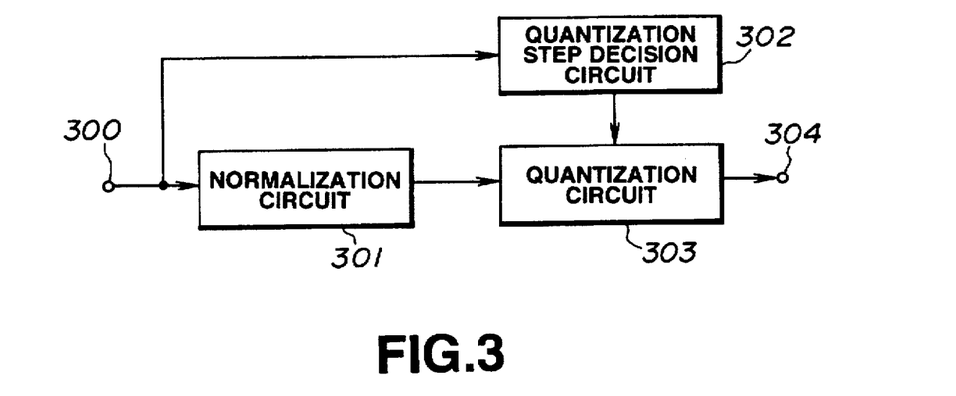
FIG. 3 is a block diagram showing a signal component encoding circuit in the encoder shown in FIG. 1.

FIG. 3 shows, in a block diagram, an illustrative configuration of a signal component encoding circuit 102 shown in FIG. 1.

In FIG. 3, an output of the signal component encoding circuit 102, fed to a terminal 300, is normalized by the normalization circuit 301 from band to band, and thence supplied to a quantization circuit 303. The signal fed to the terminal 300 is also fed to a quantization step decision circuit 302. The quantization circuit 303 quantizes a signal from the normalization circuit 301 based upon the number of quantization steps calculated by the quantization step decision circuit 302. An output of the quantization circuit 303 is outputted at a terminal 304 so as to be supplied to the code string generating circuit 103. The output signal of the terminal 304 contains the normalization coefficient information at the normalization circuit 301 and the quantization step information in the quantization step decision circuit 302, in addition to signal components quantized by the quantization circuit 303.

Figure 4:
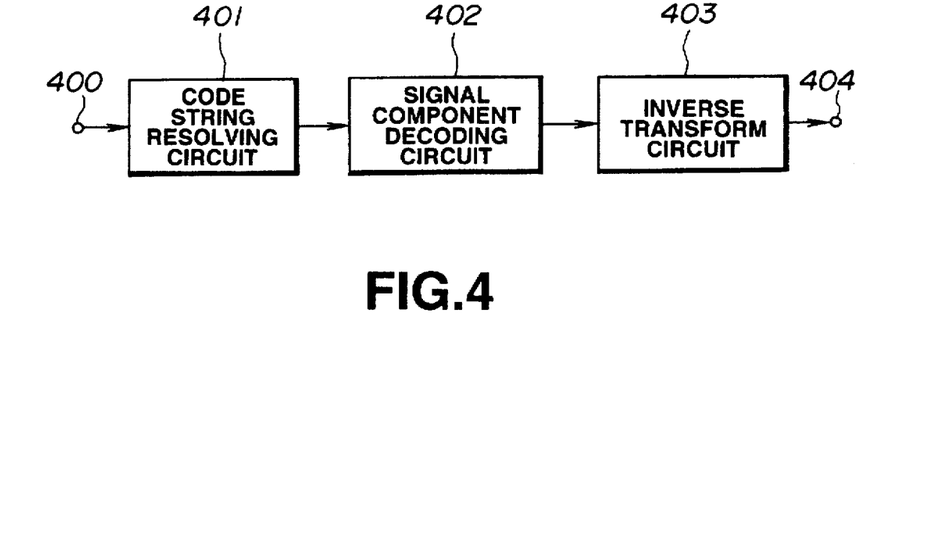
FIG. 4 is a block diagram showing a decoder embodying the present invention.

FIG. 4 shows, in a schematic block diagram, a configuration of a decoder for decoding acoustic signals from a code string generated by the encoder of FIG. 1 and outputting the decoded acoustic signals.

In FIG. 4, codes of respective signal components are extracted by the code string resolving circuit 401 from the code string generated by the configuration of FIG. 1 and supplied via a terminal 400. From these codes, signal components are decoded by a signal component decoding circuit 402 and inverse transformed by an inverse transform circuit 403 in a manner reversed from the frequency transform by the transform circuit 101 shown in FIG. 1. This produces an acoustic waveform signal which is outputted at a terminal 404.

Figure 5:
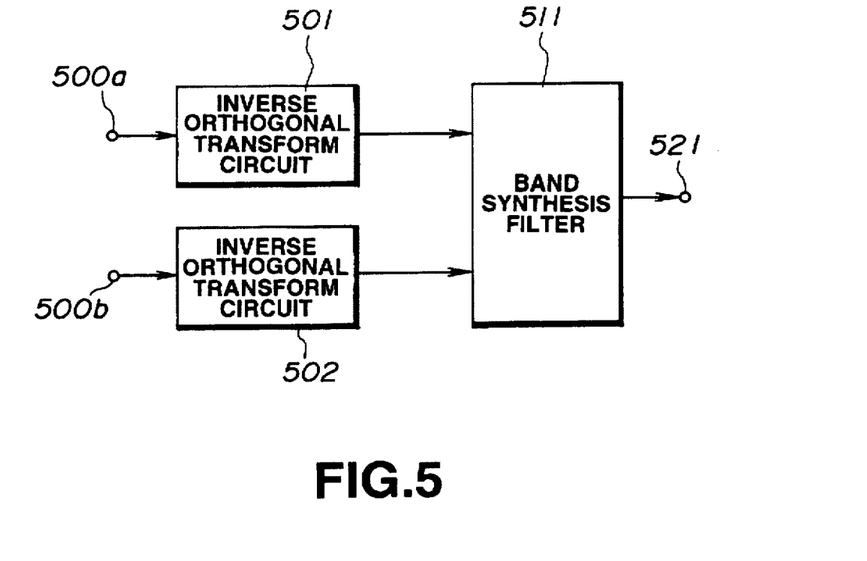
FIG. 5 is a block diagram showing an example of an inverse transform circuit of the decoder shown in FIG. 4.

FIG. 5 shows, in a block circuit diagram, an illustrative configuration of the inverse transform circuit 403 shown in FIG. 4.

The configuration shown in FIG. 5 is a counterpart of that shown in FIG. 2, such that signals supplied from the signal component decoding circuit 402 via terminals 500a, 500b are transformed by inverse orthogonal transform circuits 501, 502 performing a operation which is the reverse of the forward orthogonal transform shown in FIG. 2. The band-based signals obtained by these inverse orthogonal transform circuits 501, 502 are synthesized by a band-synthesizing filter 511. An output of the band-synthesizing filter 511 is taken out at a terminal 521, that is the terminal 404 of FIG. 4.

Figure 6:
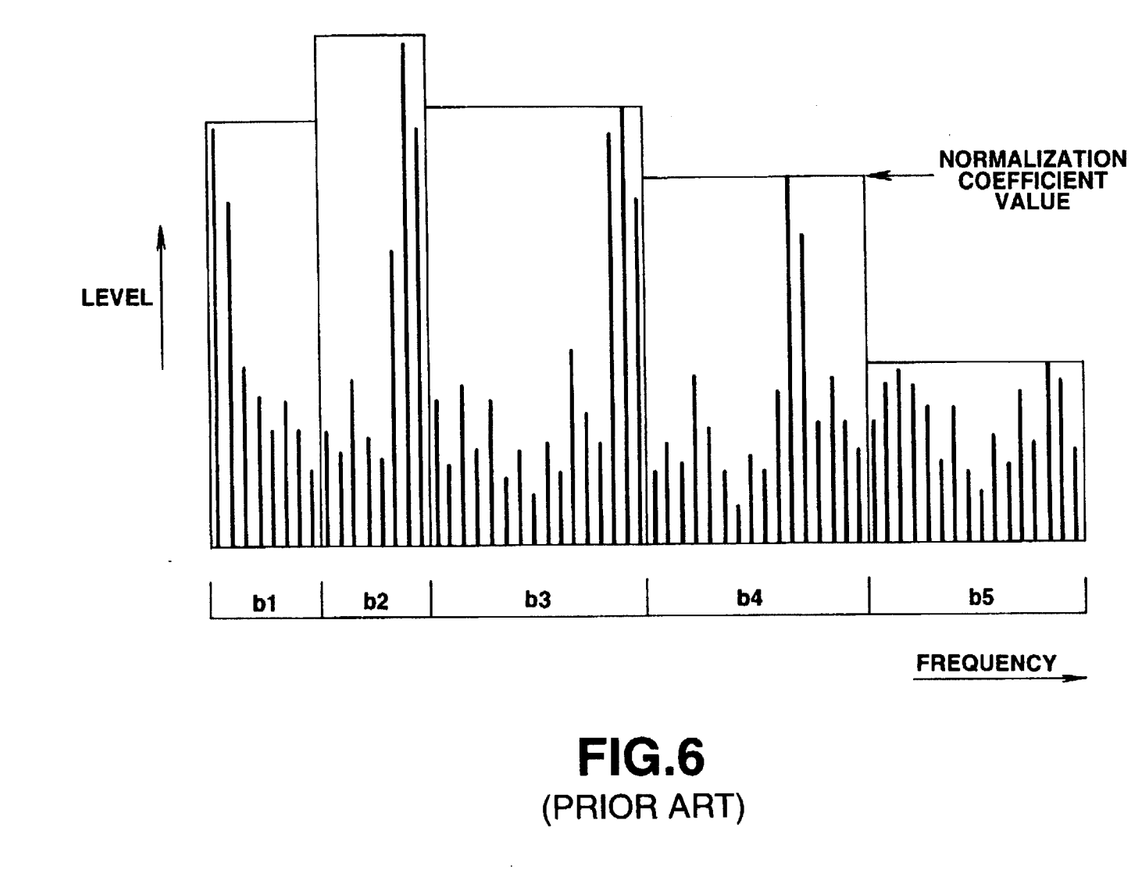
FIG. 6 is a graph showing spectral signals for illustrating a conventional encoding method.

FIG. 6 illustrates the conventional encoding method carried out by the encoder shown in FIG.1. The spectral signals in FIG. 6 are those obtained by the transform circuit 101 of FIG. 1 and represent levels of absolute values of spectral signals by MDCT in decibels.

In FIG. 6, an input signal is transformed into, for example 64 spectral signals, from one pre-set time block to another. These spectral signals are grouped in five pre-set subbands, called encoding units b1 to b5 shown in FIG. 6. The bandwidths of the encoding units are selected to be narrower and broader towards the low and high frequency sides, respectively, in order to permit generation of the quantization noise to be controlled in a manner matched to the hearing sense.

However, as may be seen from FIG. 6, if the normalization is effected from one pre-set subband to another, the values of normalization coefficients are determined by tonal components. In general, the noise added to tonal acoustic signals proves a hindrance to the hearing sense. In addition, if the tonal components are not quantized with sufficiently fine quantization steps, significant connection distortion is produced on synthesis with the waveform signals of the neighboring time blocks. Thus a large number of quantization bits need to be used in encoding tonal components. If the quantization step is determined from one pre-set subband to another, a large number of bits need to be allocated for the large number of spectral components in the encoding unit containing tonal components, thus resulting in a lowered encoding efficiency.

For overcoming such inconvenience for efficiently encoding tonal acoustic signals, the bandwidth of the encoding unit may be set to a narrower value. By setting the bandwidth of the encoding unit to a narrow value and allocating a large number of bits only to a small number of spectral coefficients making up tonal components, quantization may be achieved more efficiently and more finely. However, this increases the number of encoding units and correspondingly increases the number of normalization coefficient information data and quantization step information data to render it difficult to maintain a sufficient number of quantization steps in the totality of bands of an acoustic signal exhibiting a flatter spectral energy distribution.

Figure 7:
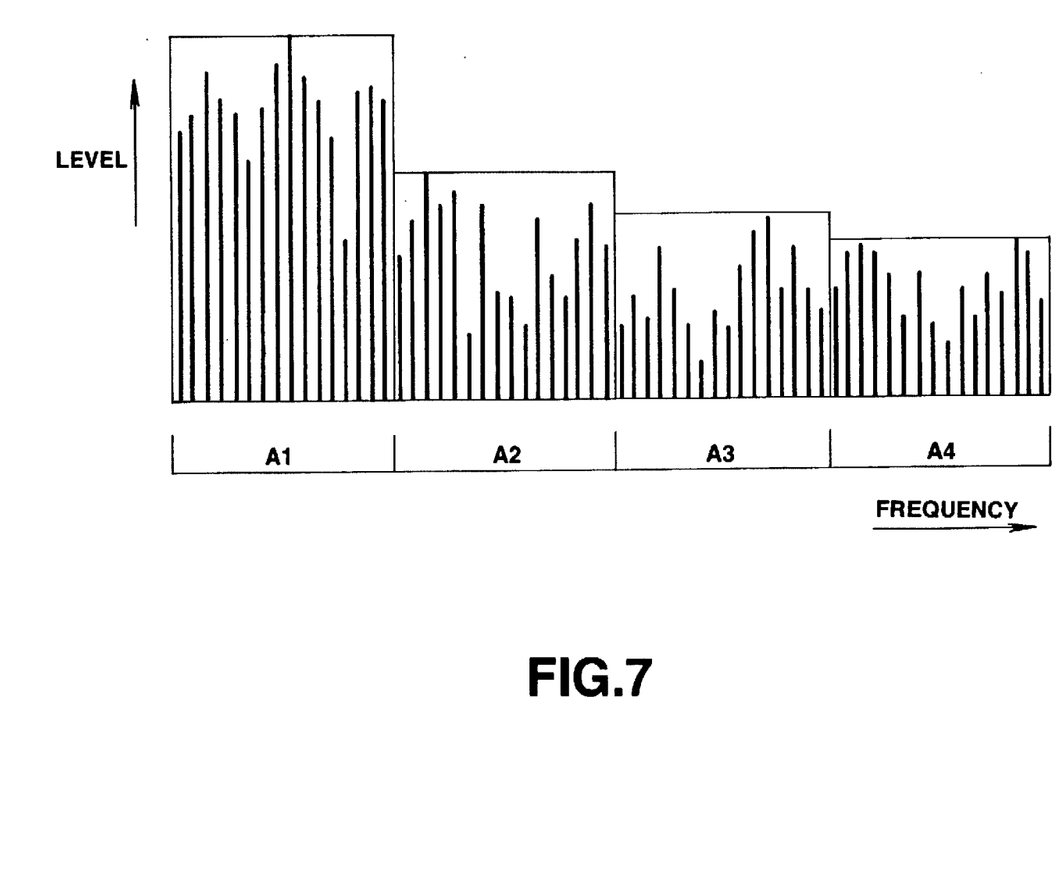
FIG. 7 is a graph showing an example of spectral signals for illustrating an encoding method according to the present invention.
Figure 8:
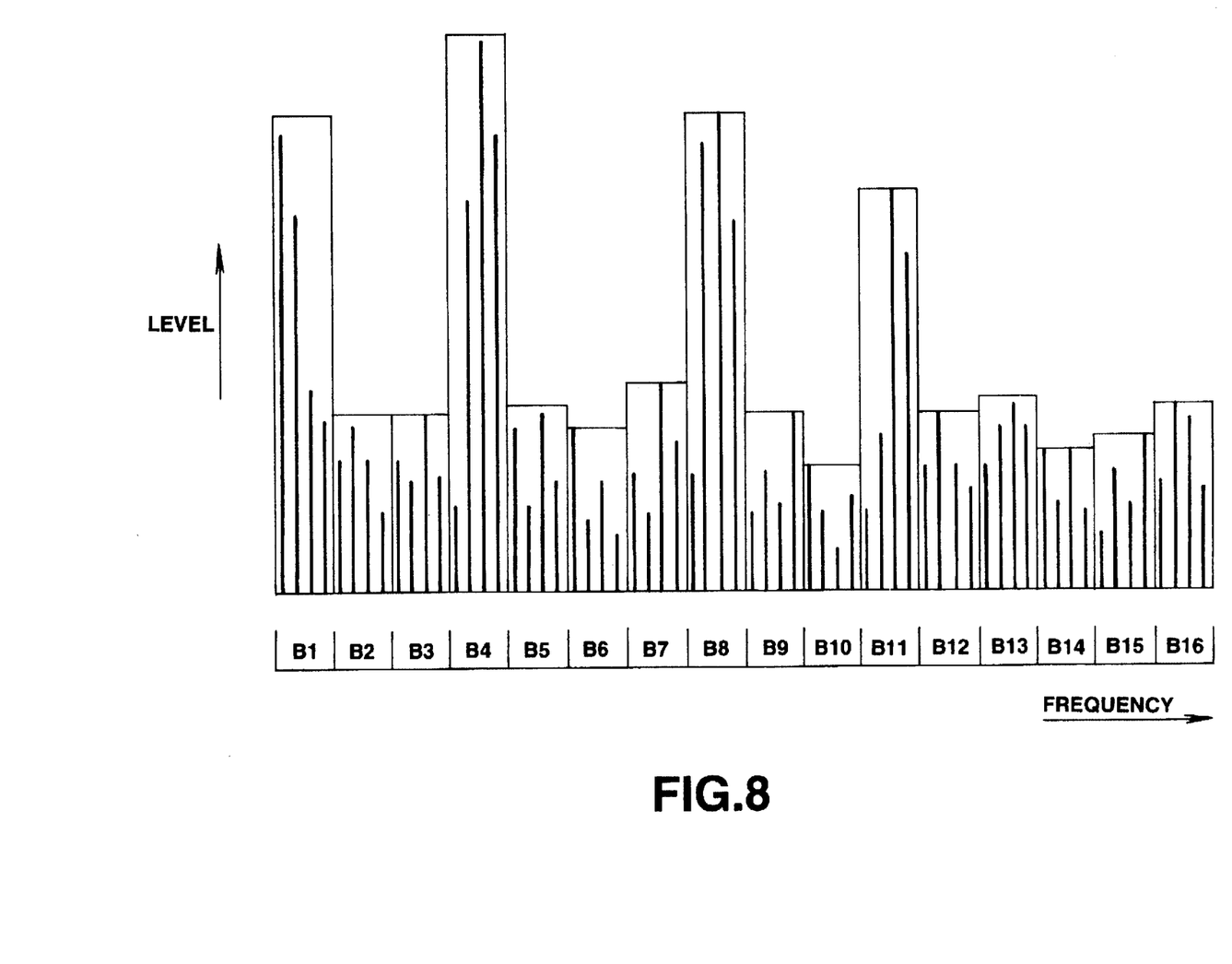
FIG. 8 is a graph showing another example of spectral signals for illustrating an encoding method according to the present invention.

FIGS. 7 and 8 illustrate the encoding method of the present invention which takes the foregoing into account.

With the information encoding method embodying the present invention, the bandwidth of the encoding unit varies with the energy distribution of input spectral signals.

That is, if the energy distribution of spectral signals to be encoded are flatter, as shown in FIG. 7, there are carried out normalization and quantization, followed by encoding, for each of encoding units A1 to A4 having broader bandwidths. This reduces the numbers of the normalization coefficient data and quantization step information data, so that more bits can be allocated for quantizing respective spectral coefficients.

Conversely, for tonal signals, in which the energy distribution is concentrated in a smaller number of spectral coefficients, as shown in FIG. 8, there are carried out normalization and quantization, followed by encoding, for each of encoding units having narrow bandwidths. By quantizing and encoding the encoding units containing only low-level spectral coefficients with an extremely small number of steps, or encoding the encoding units on the assumption that these spectral coefficients are nil if the masking effect is sufficiently strong, encoding can be achieved with an extremely small number of bits. While it is necessary to allocate a large number of quantization bits to encoding units having high-level spectral coefficients, the total number of the spectral coefficients contained in these encoding units is small, so that a smaller number of bits is required for coding the entire signal.

Figure 9:
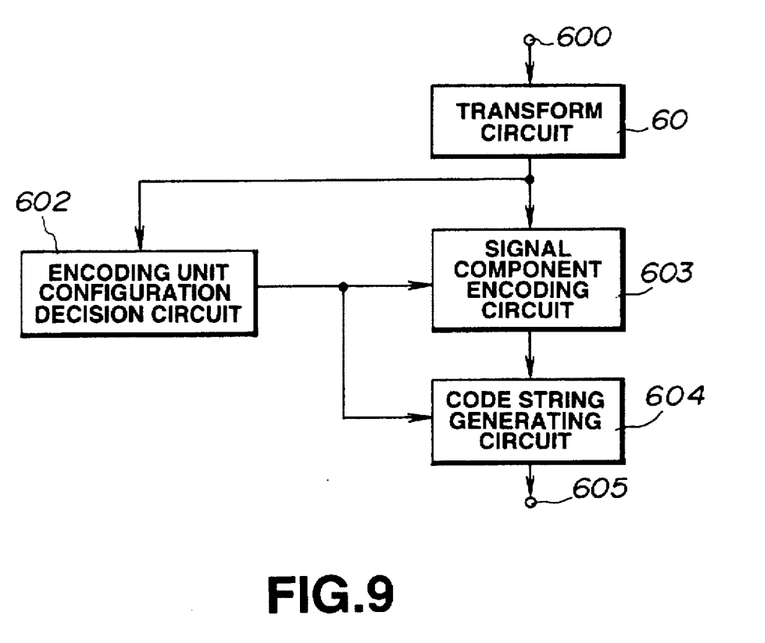
FIG. 9 is a block diagram showing an illustrative example of an encoder embodying the present invention.

FIG. 9 shows an illustrative configuration of an encoder for carrying out the above encoding.

Referring to FIG. 9, a waveform signal supplied from an input terminal 600 is transformed by a transform circuit 601 into spectral signals. An encoding unit configuration decision circuit 602 determines, based upon the energy distribution of spectral coefficients, whether the narrow-bandwidth encoding unit configuration or the broad-bandwidth encoding unit configuration should be employed, and outputs encoding unit configuration information data. A signal component encoding circuit 603 is fed with spectral signals from the transform circuit 601 and the encoding unit configuration information data from the encoding unit configuration decision circuit 602. Based upon the selected encoding unit configuration information data, the signal component encoding circuit 603 effects normalization and quantization, followed by encoding, for each of the encoding units. A code string generating circuit 604 outputs the results along with the encoding unit configuration information data in the form of a code string to a terminal 605.

Figure 10:
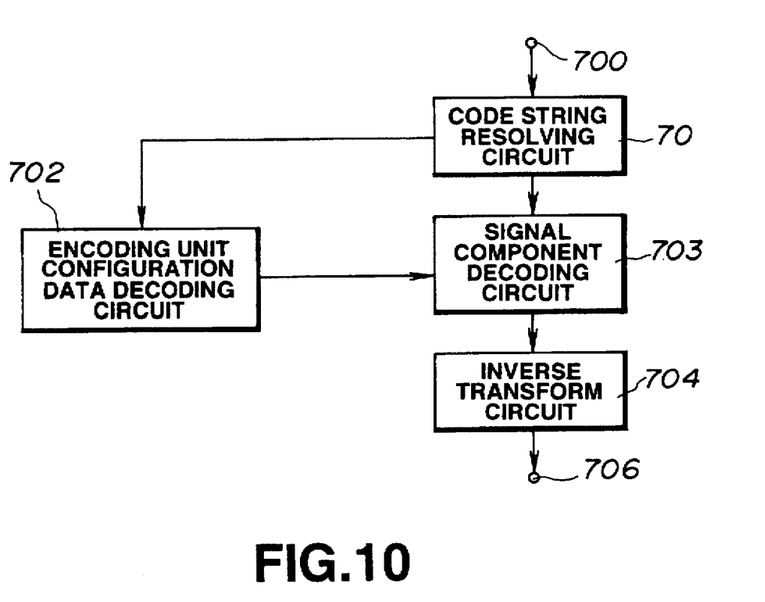
FIG. 10 is a block diagram showing an illustrative example of a decoder embodying the present invention.

FIG. 10 shows an illustrative configuration of decoding means as a counterpart of the encoding means shown in FIG. 9. A code string resolving circuit 701 extracts encoding unit configuration information codes from the input code string at a terminal 700. An encoding unit configuration information decoding circuit 702 decodes the encoding unit configuration information codes into the encoding unit configuration information data which is fed to a signal component decoding circuit 703. Based upon the encoding unit configuration information data, the signal component decoding circuit 703 decodes the spectral signals from the code string resolving circuit 701. An inverse transform circuit 704 inverse-transforms the spectral signals into a waveform signal for outputting to a terminal 706

Figure 11:
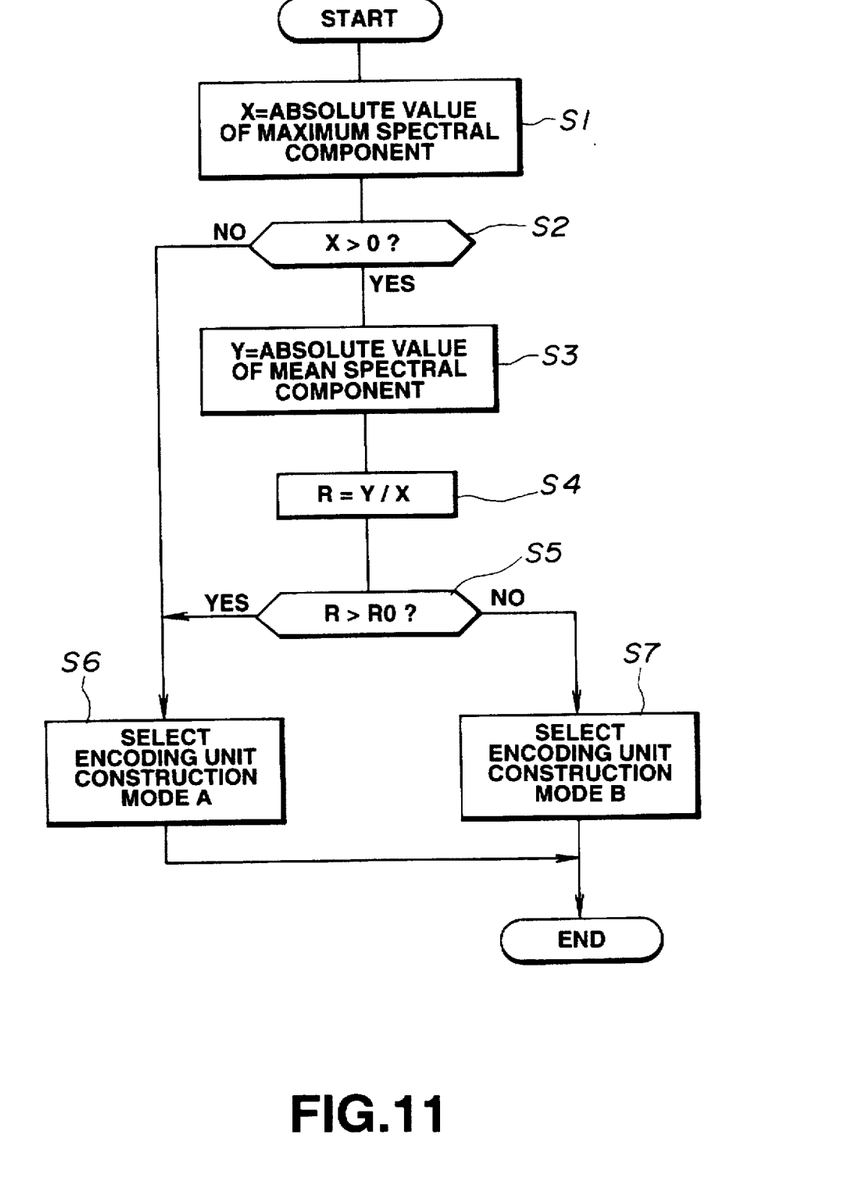
FIG. 11 is a flow chart for illustrating an illustrative example of an encoding method according to the present invention.

In FIG. 11, the encoding unit configuration mode A in FIG. 11 means a mode constructed by an encoding unit of a broad bandwidth, as shown in FIG. 7. On the other hand, the encoding unit configuration mode B means a mode constructed by an encoding unit of a narrow bandwidth, as shown in FIG. 8.

In an illustrative processing method, shown in FIG. 11, an absolute value X of a maximum spectral component is found at step S1. It is then checked at step S2 whether the value X is larger than 0, that is, that all spectral coefficient values are not equal to zero. If the value X is not zero, the program proceeds to the next step S3 in order to find an absolute value Y of mean spectral components. A ratio R of the value Y to the value X is found at step S4. If the ratio R is smaller than a pre-set value RO, it is judged that a larger deviation exists in the signal energy distribution. Thus the program proceeds to step S7 in order to select mode B for the encoding unit of a narrow bandwidth. If otherwise, the program proceeds to step S6 in order to select mode A for the encoding unit of a broad bandwidth.

If at step S2 the value of the absolute value X of the maximum spectral component is zero, that is, that all spectral coefficient values are zero, the program proceeds to step S6 in order to select the mode A. This reduces the number of the normalization coefficient information data and the quantization step information data and hence is convenient when the processing flow is applied from band to band as will be explained subsequently.

Figure 12:
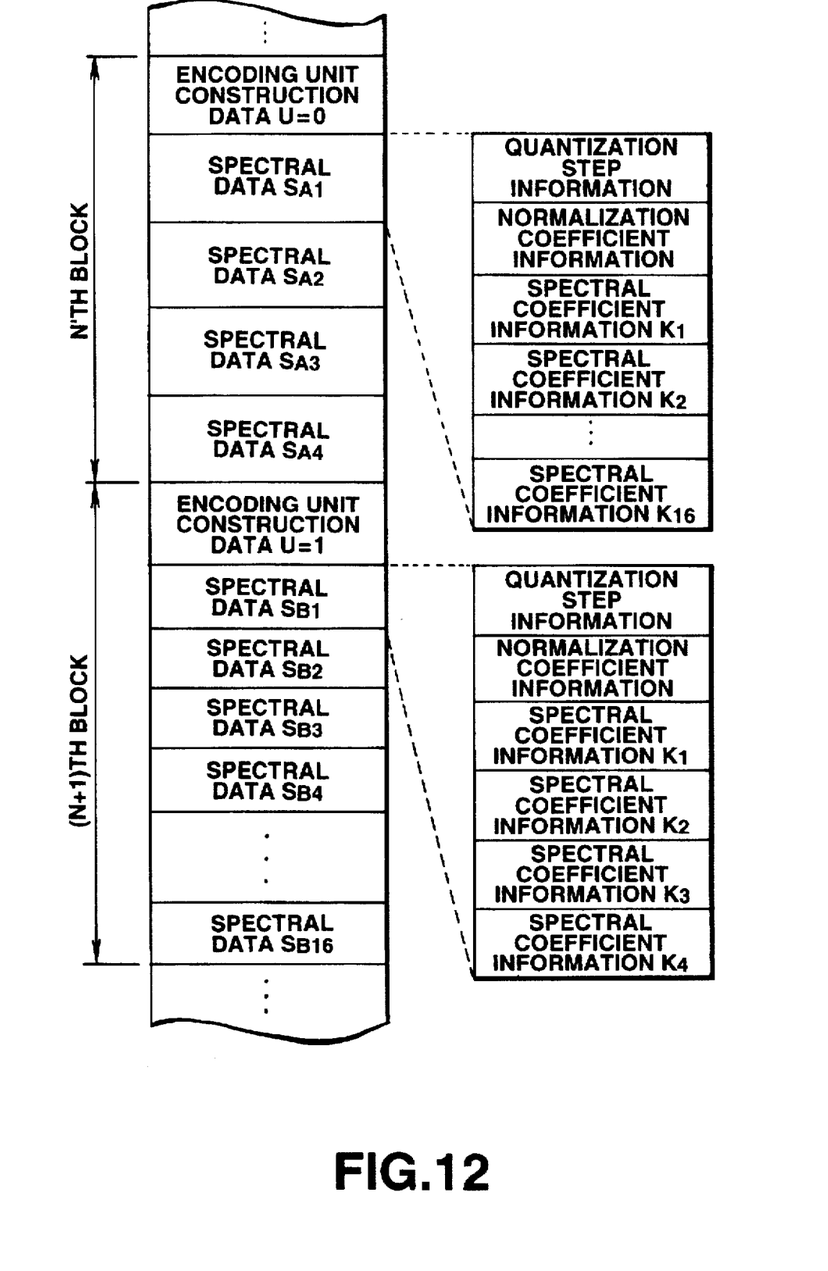
FIG. 12 illustrates an example of a code string produced on encoding by the encoding method of the present invention.

FIG. 12 shows an example of a code string obtained in this manner. There is shown herein the manner of codes of two neighboring blocks having the encoding unit configuration information data of different modes.

In the example of FIG. 12, the encoding unit configuration information data U is encoded from block to block. The respective spectral information data S is then encoded depending upon the format of the mode A or B specified by the encoding unit configuration information data. In the present example, the mode A or the mode B is selected depending on whether the encoding unit configuration information data U is 0 or 1, respectively.

That is, the spectral information S is encoded from one encoding unit to another. In the example of FIG. 12, the normalization coefficient information data and the quantization step information data of each encoding unit are placed just ahead of the respective spectral coefficient information data K. It is of course possible to encode the normalization coefficient information data and the quantization step information data for the encoding units collectively at a single position. If the quantization step information indicates that all spectral coefficients are quantized by one quantization step, that is, at 0, the normalization coefficient information data and the quantization step information data for the encoding unit may be omitted.

Figure 13:
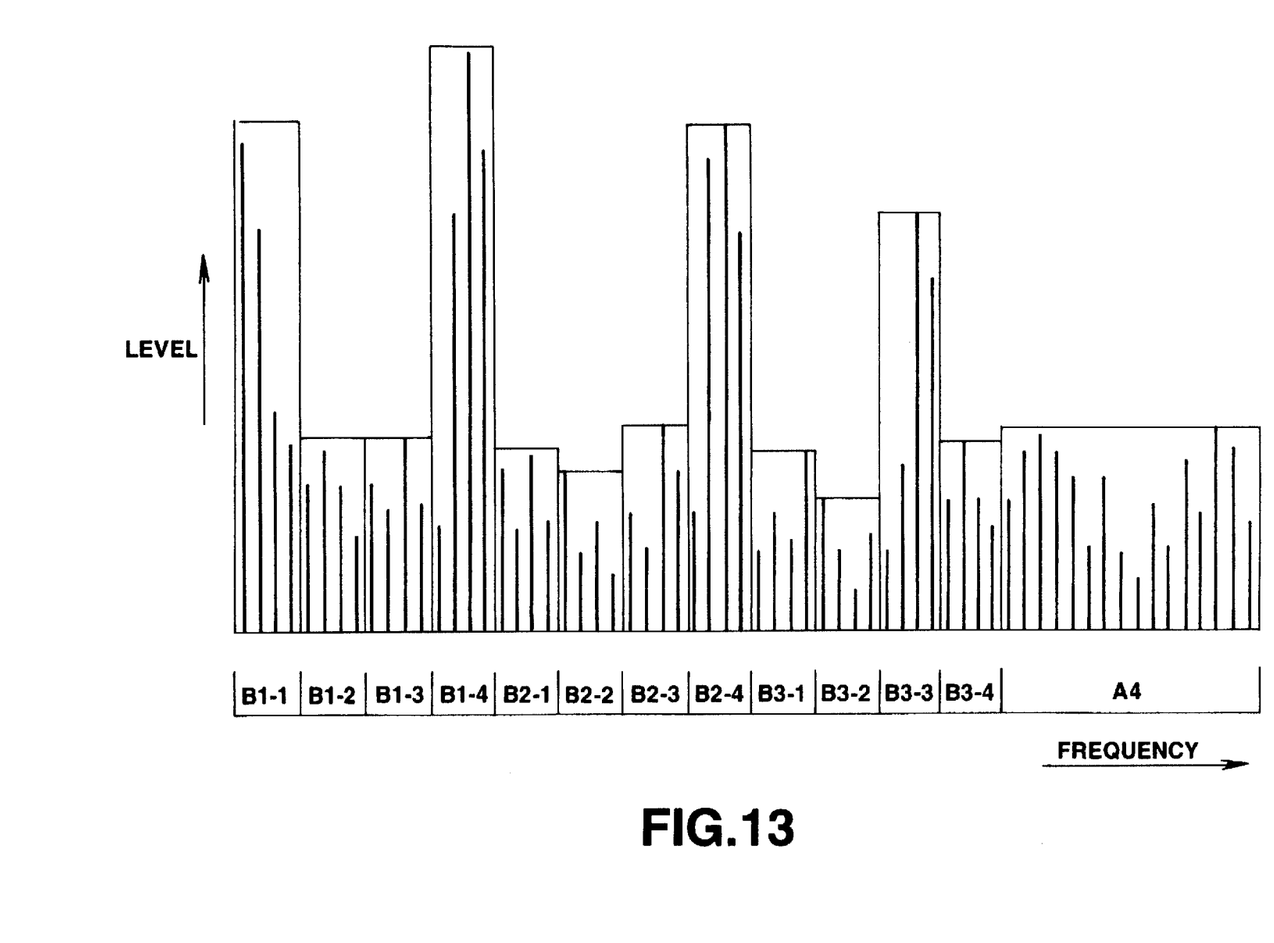
FIG. 13 illustrates another example of spectral signals for illustrating an encoding method according to the present invention.

FIG. 13 illustrates another embodiment of the present invention.

In the present embodiment, the mode A of employing an encoding unit of a broader bandwidth or the mode B of employing an encoding unit of a narrower bandwidth may be selected from one pre-set band to another, so that, by simply providing the two different modes, it is possible to exploit variegated encoding unit configurations. Thus, as shown in the example of FIG. 13, efficient bit allocation may be achieved by concentrating bits in a few spectral coefficients if, in a band, the energy is concentrated in theses few spectral coefficients, while the number of the normalization coefficient information data and the quantization step information data may be reduced in another band in which the spectrum exhibits a flatter energy distribution. In each encoding unit, the encoding unit configuration mode may be selected by the processing similar to that shown in FIG. 11. However, if all spectral coefficients are quantized at a zero value, as shown in FIG. 11, the mode A can be selected for reducing the number of the normalization coefficient information data and the quantization step information data.

Figure 14:
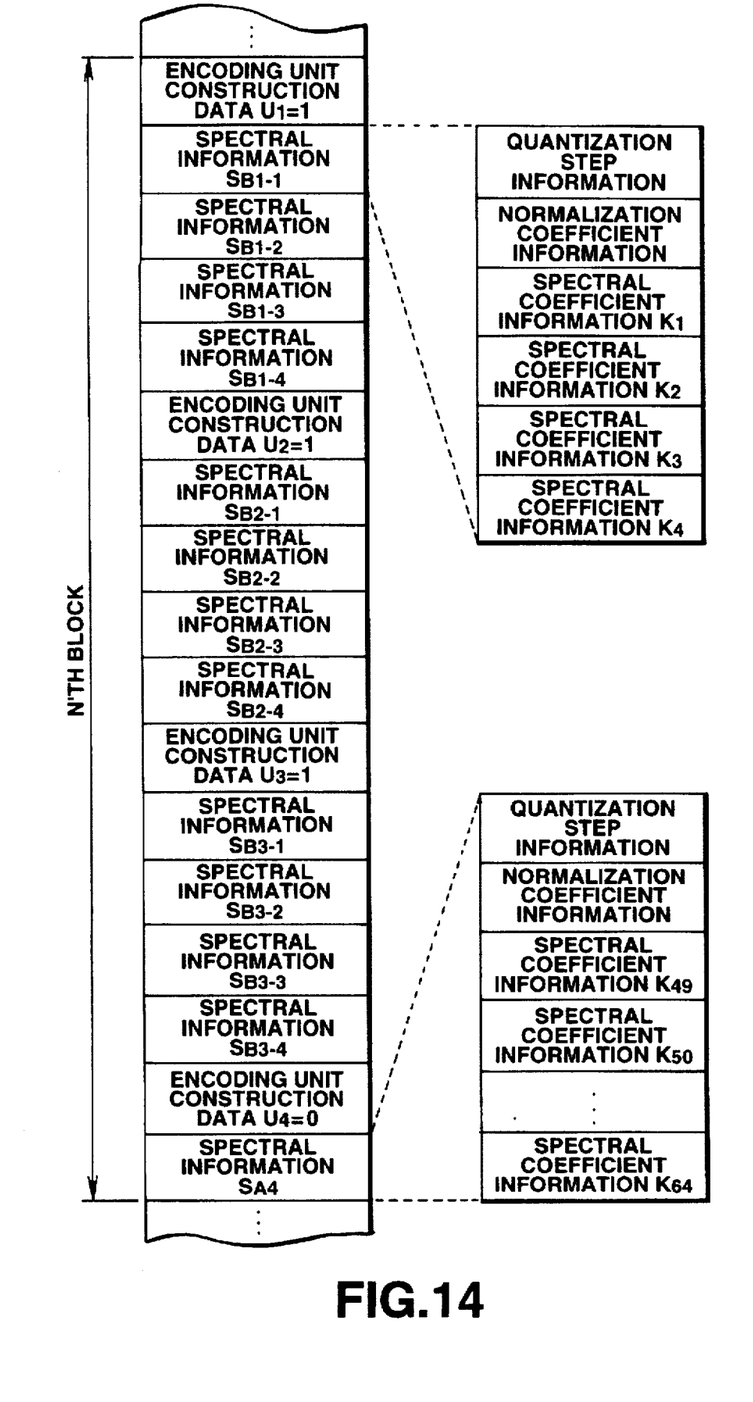
FIG. 14 illustrates an example of a code string produced on encoding by the encoding method shown in FIG. 13.

FIG. 14 shows another illustrative example of a code string obtained on encoding in the example of FIG. 13.

In the example of FIG. 14, the encoding unit configuration information data U is encoded from one band to another, and the spectral information data S is encoded in accordance with the format specified by the code.

With the above-described embodiments of the present invention, if signal components obtained by the transform means are of the same frequency resolution capacity, that is, if the number of spectral coefficients in a pre-set band is the same, efficient encoding may be achieved by variegating the bandwidth of the encoding units by energy distribution to respective signal components.

Although the above explanation has been made of converting waveform signals into spectral signals by a band-splitting filter and orthogonal transform, the waveform signal may be transformed into spectral signals solely by orthogonal transform without employing a band-splitting filter without departing from the scope of the invention.

If encoding units are constituted by frequency bands divided by a band-splitting filter, without employing orthogonal transform, such as DFT, DCT or MDCT, it is possible to specify a standard for an encoding unit configuration providing for an encoding unit of a broader bandwidth made up of a larger number of the frequency bands or an encoding unit of a narrow bandwidth made up of one or a smaller number of such frequency bands in order to apply the method of the present invention.

However, if the waveform signal is transformed into an extremely large number of, such as 512 or more, spectral signals by a method exploiting orthogonal transform, such as DFT, DCT or MDCT, and the spectral signals are collected to form an encoding unit, the bandwidths of the respective encoding units may be freely set in distinction from the case of dividing the frequency spectrum into a smaller number of, e.g., 32, bands by a band-dividing filter.

Although the two modes are provided for the encoding unit configuration, it is of course possible to use a larger number of modes.

On the other hand, although the normalization coefficient information data and the quantization step information data are provided as parameters for normalization and quantization in each encoding unit, it is unnecessary to provide these two information data independently. For example, it is possible to formulate a standard so that the level information in the respective encoding units is encoded so as to be used as the normalization coefficient information and so that the respective signal components are encoded so as to give a constant level of the quantization noise. The term "normalization and quantization for encoding" as used in the present specification is meant to include this possibility.

Although the above description has been made mainly in connection with application o f the invention to acoustic signal, the present invention may be applied to encoding of waveform signals in general. However, the present invention may be applied most effectively to acoustic signals since the code can be implemented which fully exploits psychoacoustic effects of the human hearing sense.

What is claimed is:

1. A method for encoding information comprising the steps of:

transforming an input signal into frequency components;

normalizing and quantizing an output of the transforming step from one encoding unit to another for encoding resulting data; and providing a plurality of encoding unit configuration modes for resolving the frequency components into plural encoding units and adaptively selecting and determining one of the encoding unit configuration modes depending upon the spectral shape of the frequency components.

2. The method as claimed in claim 1, wherein a plurality of the encoding unit configuration modes are provided for the same frequency resolution.

3. The method as claimed in claim 1, wherein said transforming step includes an orthogonal transform step.

4. The method as claimed in claim 1, wherein each encoding unit contains plural bandwidths for different frequencies.

5. The method as claimed in claim 1, wherein said plural encoding unit configuration modes are set from one pre-set frequency band to another.

6. The method as claimed in claim 1, wherein said plural encoding unit configuration modes are set for the entire frequency range.

7. The method as claimed in claim 1, wherein if the spectral component of the signal in frequency domain exhibit a flatter energy distribution, the frequency components are resolved into a fewer number of encoding units of broader bandwidths.

8. The method as claimed in claim 1, wherein the input signal is an acoustic signal.

9. An apparatus for encoding information comprising:

transform means for transforming an input signal into frequency components;

encoding unit configuration decision means for adaptively selecting one of a plurality of encoding unit configuration modes for resolving the frequency components into respective encoding units depending upon the spectral shape of the frequency components and providing an encoding unit configuration information data;

signal component encoding means for normalizing, quantizing and encoding an output of said transform means for each encoding unit as determined by said encoding unit configuration decision means; and code string generating means for generating a code string based upon an encoded output of said signal component encoding means and the encoding unit configuration information data from said encoding unit configuration decision means.

10. A method for decoding an encoded signal comprising the steps of:

decoding an encoding unit configuration information data;

inverse transforming frequency components of the signal into time-domain signals; and de-normalizing and inverse quantizing the frequency components of the signal for decoding each encoding unit of the selected encoding unit configuration based upon the encoding unit configuration information data decoded by said decoding step.

11. The method as claimed in claim 10, wherein said transforming step includes an inverse orthogonal transform step.

12. The method as claimed in claim 10, wherein each encoding unit contains plural bandwidths for different frequencies.

13. The method as claimed in claim 10, wherein said plural encoding unit configuration modes are set from one pre-set frequency band to another.

14. The method as claimed in claim 10, wherein said plural encoding unit configuration modes are set for the entire frequency range.

15. The method as claimed in claim 10, wherein the input signal is an acoustic signal.

16. An apparatus for decoding information comprising:

code string resolving means for resolving an input code string into frequency component codes and encoding unit configuration information codes;

decoding means for decoding said encoding unit configuration information code from said code string resolving means and providing an encoding unit configuration information data;

frequency component decoding means for decoding the frequency component code from said code string resolving means; and inverse transform means for transforming frequency components from said frequency component decoding means into time-domain signals;

wherein denormalization and dequantization of the frequency components for decoding is carried out for each selected one of the plural encoding units of the encoding unit configurations based upon the encoding unit configuration information data decoded by the decoding means.

* * * * *